United States Patent
Goktepeli

(10) Patent No.: US 10,431,558 B2
(45) Date of Patent: *Oct. 1, 2019

(54) METHOD AND APPARATUS FOR BACK-BIASED SWITCH TRANSISTORS

(71) Applicant: QUALCOMM Incorporated, San Diego, CA (US)

(72) Inventor: Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/988,916

(22) Filed: May 24, 2018

(65) Prior Publication Data

US 2018/0277502 A1    Sep. 27, 2018

Related U.S. Application Data

(62) Division of application No. 15/189,893, filed on Jun. 22, 2016, now Pat. No. 10,002,838.

(51) Int. Cl.
| | |
|---|---|
| H01L 21/36 | (2006.01) |
| H01L 21/00 | (2006.01) |
| H01L 23/66 | (2006.01) |
| H01L 41/09 | (2006.01) |
| H01L 27/146 | (2006.01) |
| H01L 23/522 | (2006.01) |
| H01L 29/66 | (2006.01) |
| H01L 29/786 | (2006.01) |
| H01L 27/12 | (2006.01) |
| H01L 23/48 | (2006.01) |

(52) U.S. Cl.
CPC .......... *H01L 23/66* (2013.01); *H01L 23/5225* (2013.01); *H01L 27/1203* (2013.01); *H01L 27/1464* (2013.01); *H01L 29/66742* (2013.01); *H01L 29/78603* (2013.01); *H01L 29/78633* (2013.01); *H01L 29/78648* (2013.01); *H01L 41/09* (2013.01); *H01L 23/481* (2013.01); *H01L 2224/03002* (2013.01); *H01L 2224/0401* (2013.01); *H01L 2224/11002* (2013.01); *H01L 2224/13022* (2013.01); *H01L 2924/1421* (2013.01)

(58) Field of Classification Search
CPC ...................................................... H01L 23/66
USPC .......................................... 257/502; 438/35
See application file for complete search history.

(56) References Cited

U.S. PATENT DOCUMENTS

| | | |
|---|---|---|
| 7,691,716 B2 | 4/2010 | Ho et al. |
| 7,772,649 B2 | 8/2010 | Cheng et al. |
| 8,530,963 B2 | 9/2013 | Davies et al. |
| (Continued) | | |

OTHER PUBLICATIONS

International Search Report and Written Opinion—PCT/US2017/034294—ISA/EPO—dated Aug. 17, 2017.

*Primary Examiner* — Calvin Lee
(74) *Attorney, Agent, or Firm* — Qualcomm Incorporated/Seyfarth Shaw LLP

(57) ABSTRACT

An integrated radio frequency (RF) circuit structure may include an active device on a first surface of an isolation layer. The integrated RF circuit structure may also include a back-bias metallization on a second surface opposite the first surface of the isolation layer. A body of the active device is biased by the back-bias metallization. The integrated RF circuit structure may further include a handle substrate on a front-side dielectric layer on the active device.

5 Claims, 13 Drawing Sheets

(56) References Cited

U.S. PATENT DOCUMENTS

| | | |
|---|---|---|
| 8,803,206 B1 | 8/2014 | Or-Bach et al. |
| 9,023,688 B1 | 5/2015 | Or-Bach et al. |
| 9,294,083 B2 | 3/2016 | Cebi et al. |
| 10,002,838 B2 * | 6/2018 | Goktepeli ............ H01L 27/1464 257/502 |
| 2005/0282381 A1 | 12/2005 | Cohen et al. |
| 2015/0137307 A1 | 5/2015 | Stuber et al. |
| 2017/0373026 A1 | 12/2017 | Goktepeli |

* cited by examiner

METHOD AND APPARATUS FOR BACK-BIASED SWITCH TRANSISTORS

CROSS-REFERENCE TO RELATED APPLICATION

The present application is a divisional of U.S. patent application Ser. No. 15/189,893, filed on Jun. 22, 2016, now U.S. Pat. No. 10,002,838, issued Jun. 19, 2018, and titled "METHOD AND APPARATUS FOR BACK-BIASED SWITCH TRANSISTORS," the disclosure of which is expressly incorporated by reference herein in its entirety.

TECHNICAL FIELD

The present disclosure generally relates to integrated circuits (ICs). More specifically, the present disclosure relates to a method and apparatus for a back-biased switch transistor.

BACKGROUND

One goal driving the wireless communication industry is providing consumers with increased bandwidth. The use of carrier aggregation in current generation communications provides one possible solution for achieving this goal. Carrier aggregation enables a wireless carrier, having licenses to two frequency bands (e.g., 700 MHz and 2 GHz) in a particular geographic area, to maximize bandwidth by simultaneously using both frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components.

Mobile RF chip designs (e.g., mobile RF transceivers), including high performance diplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

SUMMARY

An integrated radio frequency (RF) circuit structure may include an active device on a first surface of an isolation layer. The integrated RF circuit structure may also include a back-bias metallization on a second surface opposite the first surface of the isolation layer. A body of the active device is biased by the back-bias metallization. The integrated RF circuit structure may further include a handle substrate on a front-side dielectric layer on the active device.

A method of constructing an integrated RF circuit structure may include fabricating an active device supported by a first surface of an isolation layer and disposed on a sacrificial substrate. The method may also include depositing a front-side dielectric layer on the active device. The method may further include bonding a handle substrate to the front-side dielectric layer. The method may also include removing the sacrificial substrate. The method may further include fabricating a back-bias metallization on a second surface opposite the first surface of the isolation layer. A body of the active device is biased by the back-bias metallization.

An integrated RF circuit structure may include an active device on a first surface of an isolation layer. The integrated RF circuit structure may also include means for back-biasing a body of the active device arranged on a second surface opposite the first surface of the isolation layer. The integrated RF circuit structure may further include a handle substrate on a front-side dielectric layer disposed on the active device.

A RF front end module may include an integrated RF circuit structure. The integrated RF circuit structure may include a switch transistor on a first surface of an isolation layer. The integrated RF circuit structure may also include a back-bias metallization on a second surface opposite the first surface of the isolation layer. A body of the switch transistor is biased by the back-bias metallization. The integrated RF circuit structure may further include a handle substrate on a front-side dielectric layer disposed on the switch transistor. The integrated RF front end module may also include an antenna coupled to an output of the switch transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
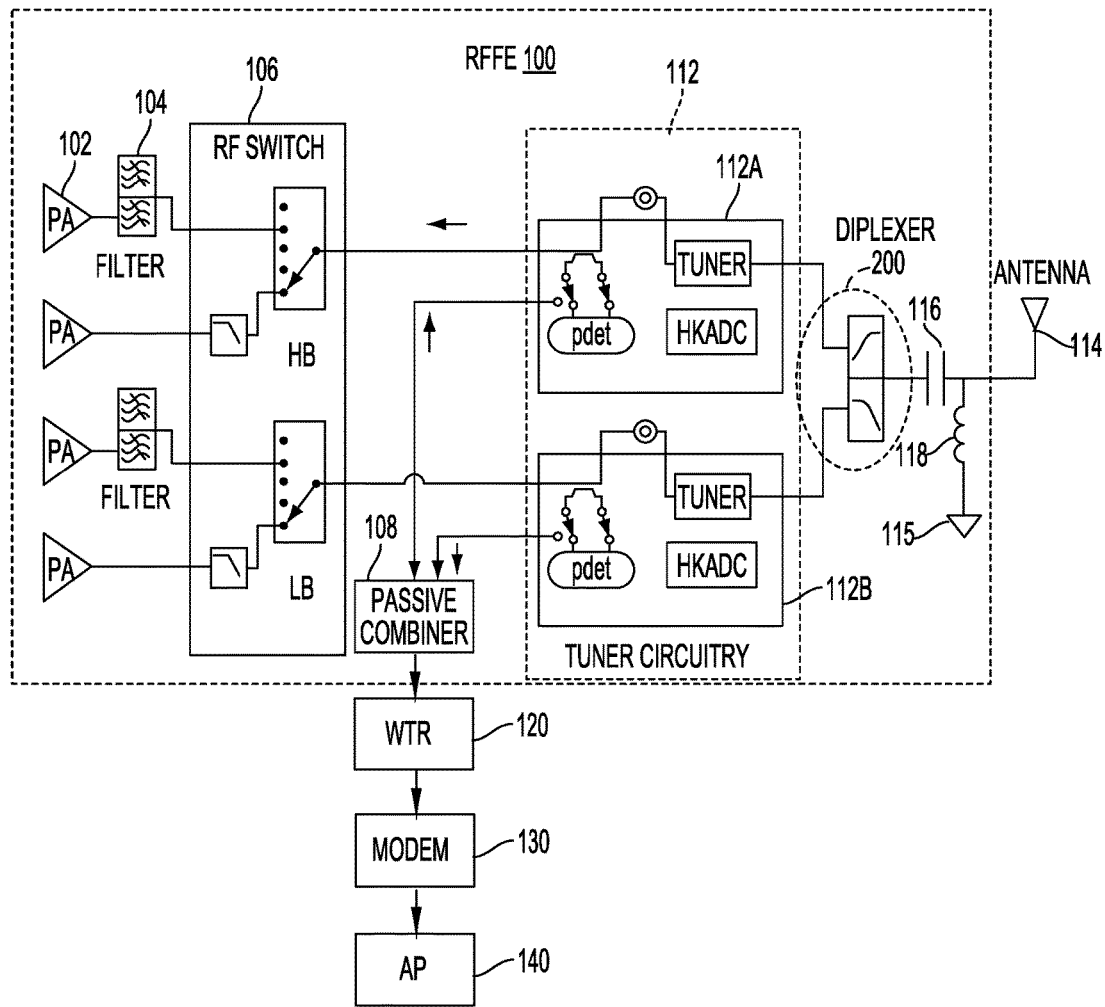
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. In particular, the formation of conductive material plating for semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile RF transceiver design.

The design of these mobile RF transceivers may include the use of silicon on insulator technology. Silicon on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of an active device on the silicon layer and a substrate supporting the BOX layer.

In particular, a transistor fabricated using SOI technology suffers from the floating body effect, in which the transistor's body forms a capacitor against the insulated substrate. In this arrangement, charge that accumulates on the capacitor causes adverse effects, such as parasitic transistors in the structure and off-state leakage. In addition, the accumulated charge also causes dependence of the threshold voltage of the transistor on its previous states. As a result, aspects of the present disclosure include a layer transfer process to further separate the active devices from the substrate.

Various aspects of the disclosure provide techniques for back-biasing switch transistors in integrated RF circuit structures. The process flow for semiconductor fabrication of the integrated RF circuit structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe back-biasing of an antenna switch transistor in integrated radio frequency (RF) circuit structures for high quality (Q)-factor RF applications. In one arrangement, a post layer-transfer metallization is used to form a post-layer transfer metallization layer to bias an active device body and reduce the floating body effect. The post transfer metallization process may form a back-bias metallization on a second surface of an isolation layer, in which a first surface of the isolation layer supports the active device. In this arrangement, a body of the active device is biased by the back-bias metallization. A handle substrate is also arranged on a front-side dielectric layer that is on the active device distal from the back-bias metallization. In this arrangement, the backside metallization at least partially provides an RF shield to prevent high order harmonics in support of carrier aggregation.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
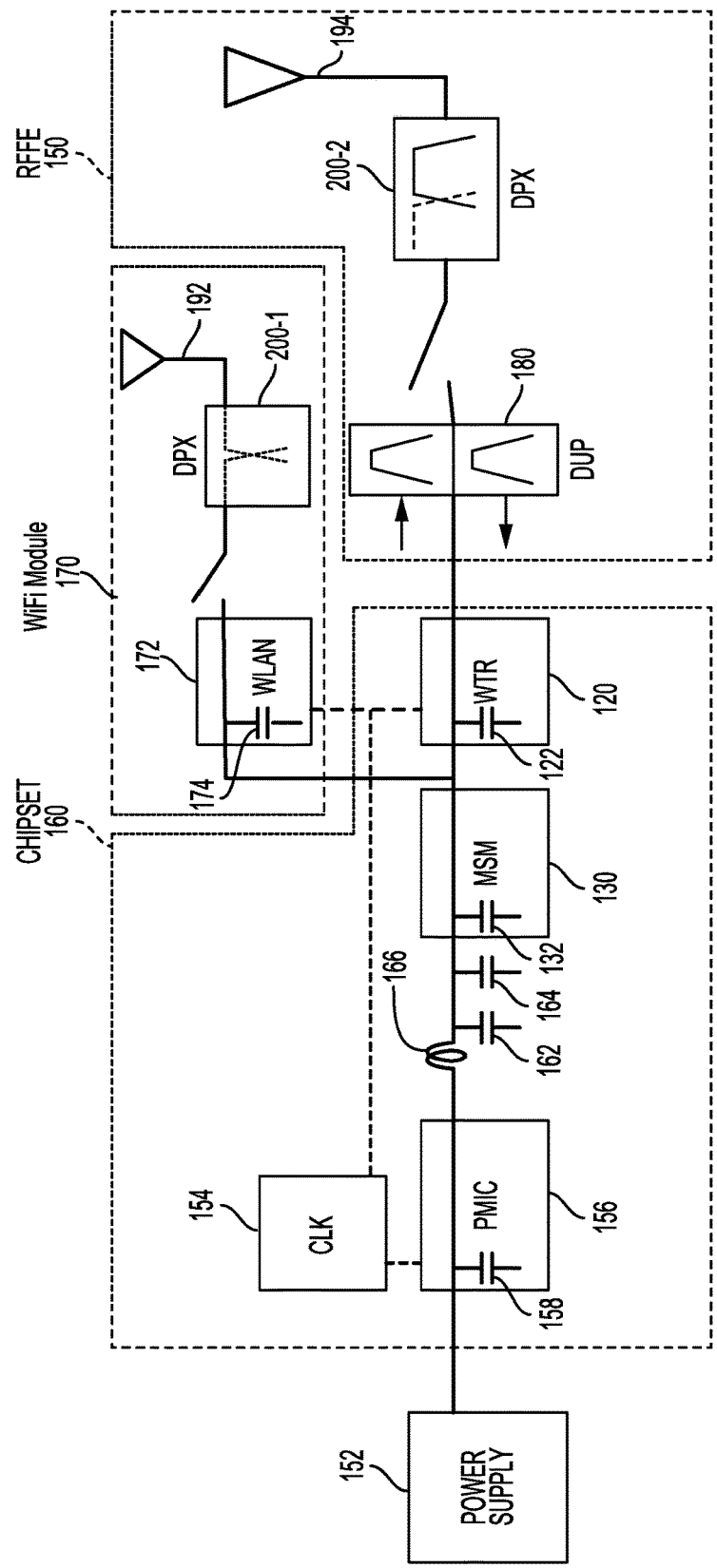
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
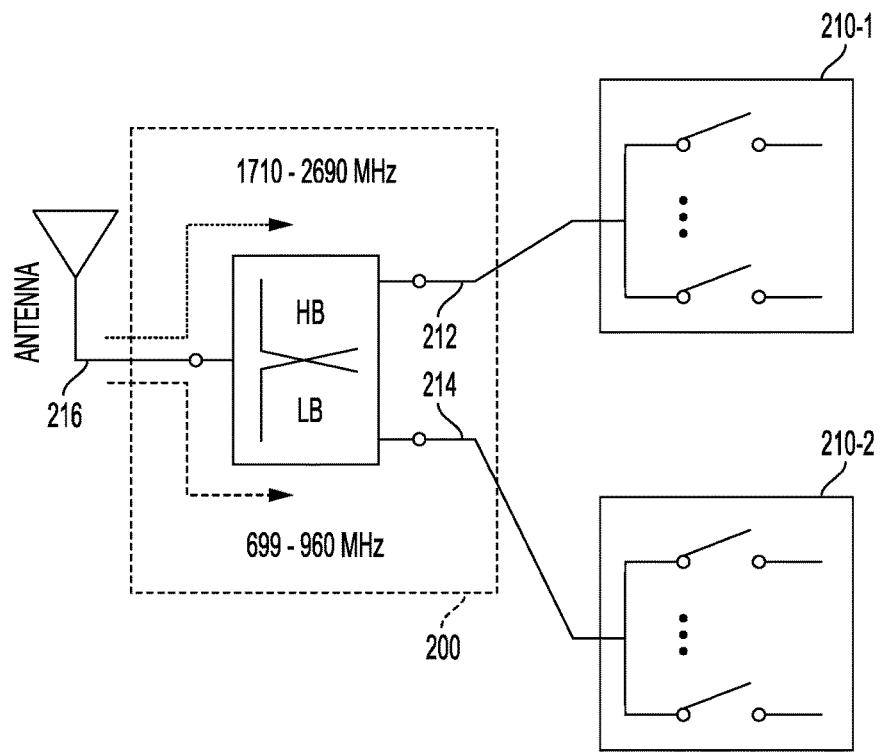
FIG. 2A is a diagram of a diplexer design according to an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
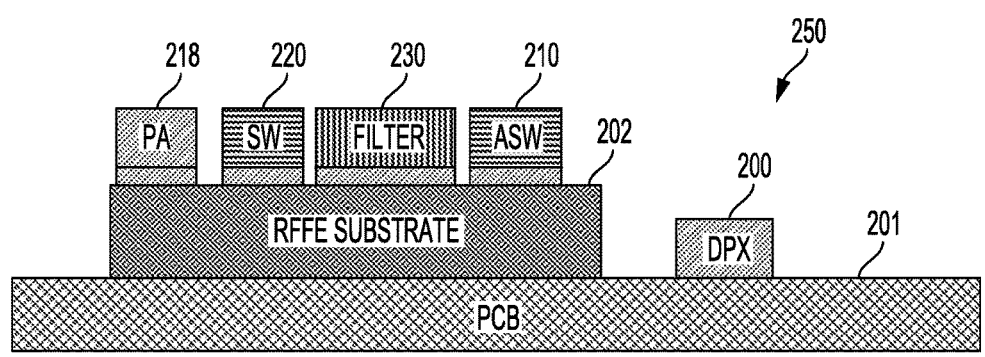
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this arrangement, the RF front end module 250 is implemented using silicon on insulator (SOI) technology, which helps reduce high order harmonics in the RF front end module 250. SOI technology replaces conventional silicon substrates with a layered silicon-insulator-silicon substrate to reduce parasitic device capacitance and improve performance. SOI-based devices differ from conventional silicon-built devices because the silicon junction is above an electrical insulator, typically a buried oxide (BOX) layer. A reduced thickness BOX layer, however, may not sufficiently reduce the parasitic capacitance caused by the proximity between an active device (on the silicon layer) and a substrate supporting the BOX layer. As a result, aspects of the present disclosure include a layer transfer process to further separate the active device from the substrate, as shown in FIGS. 3A to 3E.

Figure 3A:
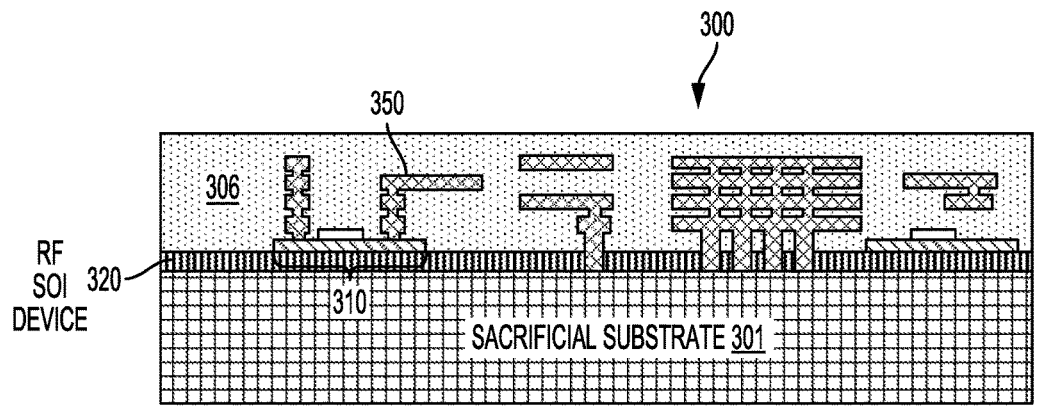
FIGS. 3A to 3E show cross sectional views of an integrated radio frequency (RF) circuit structure during a layer transfer process according to aspects of the present disclosure.
Figure 3B:
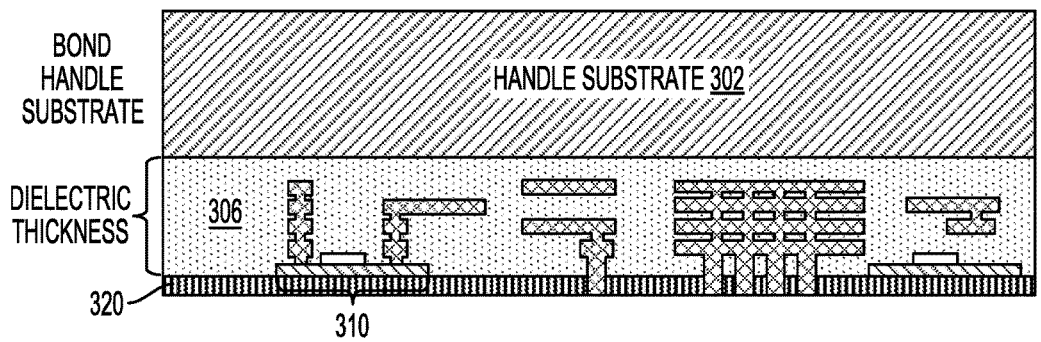

FIGS. 3A to 3E show cross sectional views of an integrated radio frequency (RF) circuit structure 300 during a layer transfer process according to aspects of the present disclosure. As shown in FIG. 3A, an RF silicon on insulator (SOI) device includes an active device 310 on a buried oxide (BOX) layer 320 supported by a sacrificial substrate 301 (e.g., a bulk wafer). The RF SOI device also includes interconnects 350 coupled to the active device 310 within a first dielectric layer 306. As shown in FIG. 3B, a handle substrate 302 is bonded to the first dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the active device 310 and the handle substrate 302.

Figure 3C:
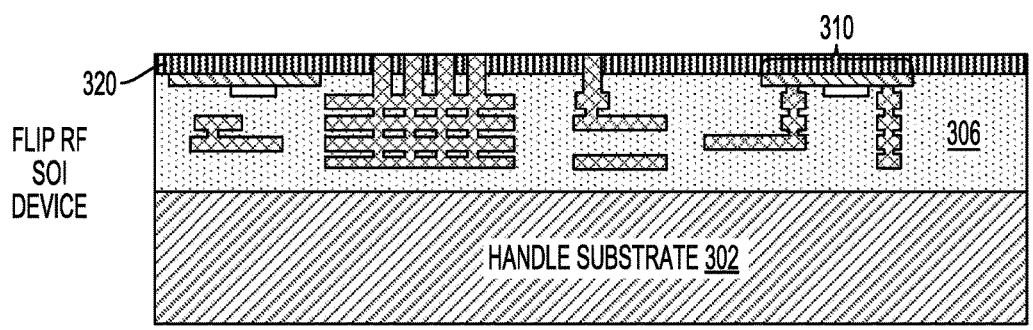
Figure 3D:
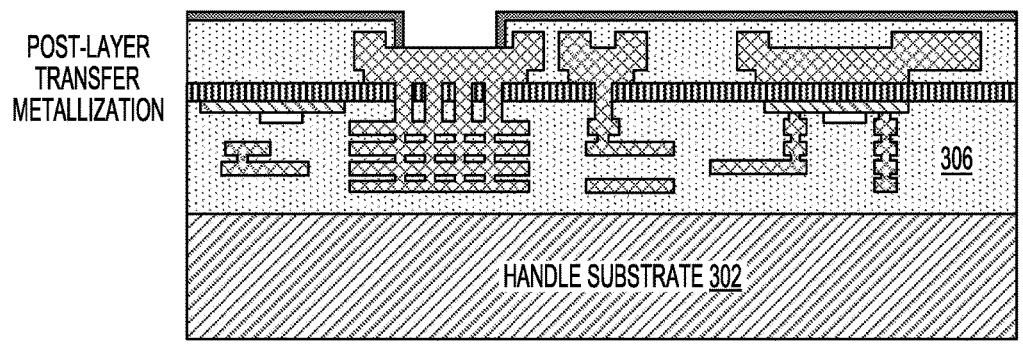
Figure 3E:
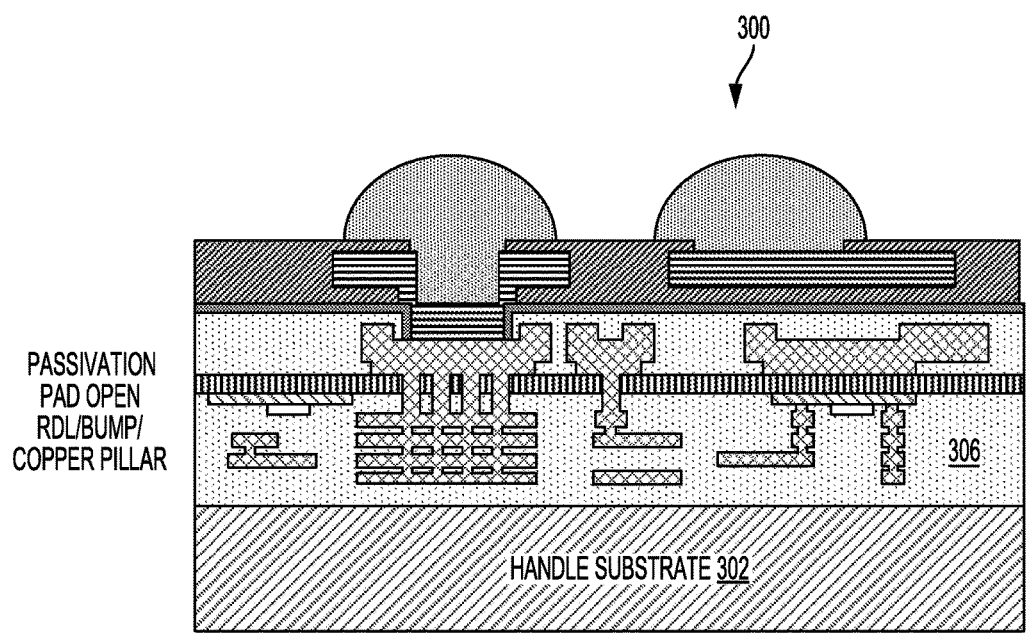

As shown in FIG. 3C, the RF SOI device is flipped once the handle substrate 302 is secured and the sacrificial substrate 301 is removed. As shown in FIG. 3D, a post layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)).

Referring again to FIG. 3A, the RF SOI device may include an optional RF enhancement layer between the sacrificial substrate 301 and the BOX layer 320. In addition, the sacrificial substrate 301 may be replaced with the handle substrate, and a thickness of the BOX layer 320 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 3A, the increased thickness of the BOX layer 320 does not provide sufficient distance between the active device 310 and the sacrificial substrate 301 relative to the configurations shown in FIGS. 3B to 3E. Moreover, a body of the active device 310 in the RF SOI device may not be tied.

Figure 4:
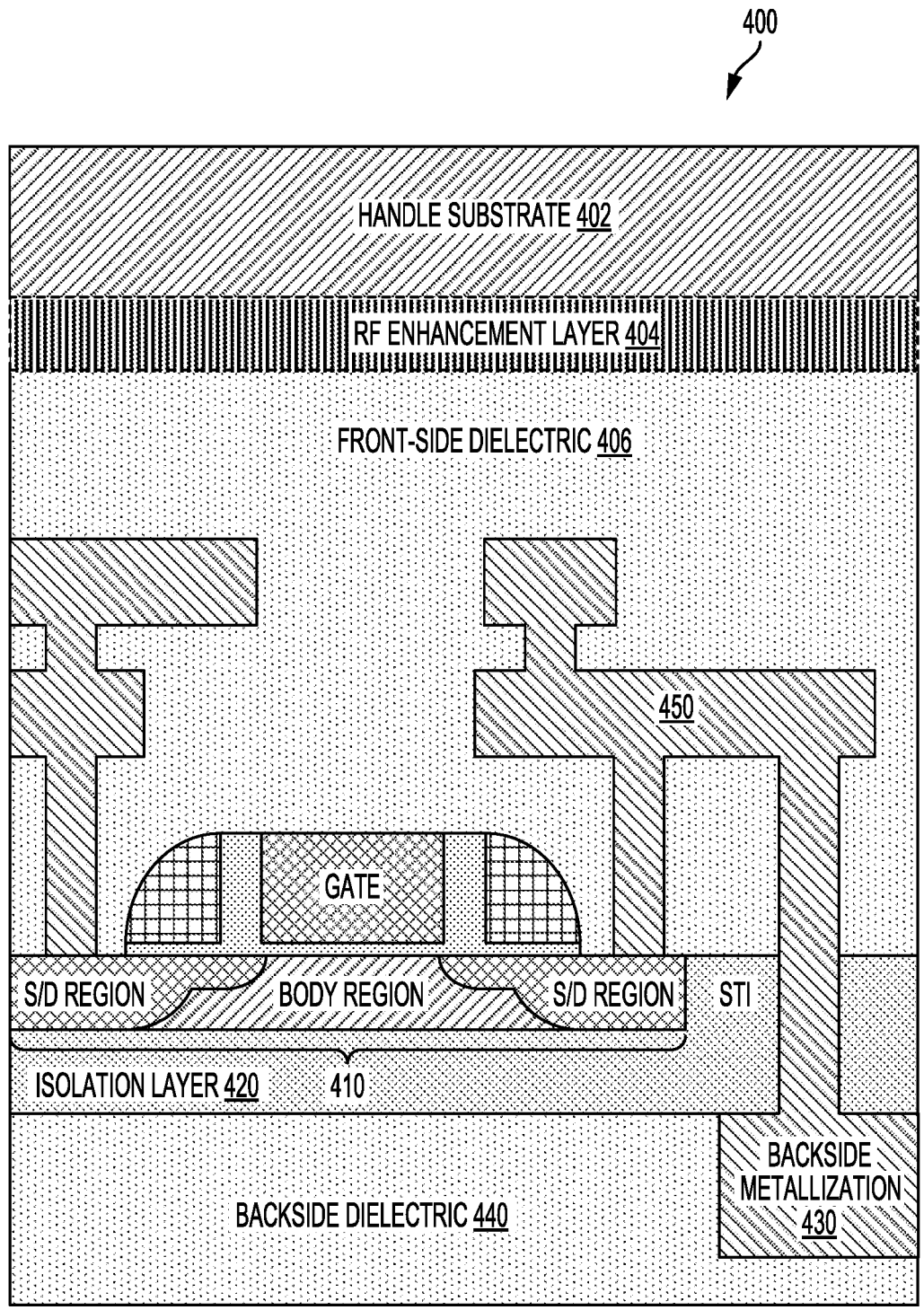
FIG. 4 is a cross sectional view of an integrated radio frequency (RF) circuit structure fabricated using a layer transfer process according to aspects of the present disclosure.

FIG. 4 is a cross sectional view of an integrated RF circuit structure 400 fabricated using a layer transfer process according to aspects of the present disclosure. Representatively, the integrated RF circuit structure 400 includes an active device 410 having a gate, a body, and source/drain regions formed on an isolation layer 420. In silicon on insulator (SOI) implementations, the isolation layer 420 is a buried oxide (BOX) layer, and the body and source/drain regions are formed from an SOI layer including shallow trench isolation (STI) regions supported by the BOX layer.

The integrated RF circuit structure 400 also includes middle-end-of-line (MEOL)/back-end-of-line (BEOL) interconnects coupled to the source/drain regions of the active device 410. As described herein, the MEOL/BEOL layers are referred to as front-side layers. By contrast, the layers supporting the isolation layer 420 may be referred to herein as backside layers. According to this nomenclature, a front-side metallization 450 is coupled to the source/drain regions of the active device 410 and arranged in a front-side dielectric layer 406. In addition, a handle substrate 402 is coupled to the front-side dielectric layer 406 through an RF enhancement layer 404. In this arrangement, a backside dielectric 440 is adjacent to and possibly supports the isolation layer 420. A backside metallization 430 is coupled to the front-side metallization 450.

As shown in FIG. 4, a layer transfer process provides increased separation between the active device 410 and the handle substrate 402 to improve the harmonics of the integrated RF circuit structure 400. While the layer transfer process enables high-performance, low-parasitic RF devices, the integrated RF circuit structure 400 may suffer from the floating body effect. Accordingly, the performance of the integrated RF circuit structure 400 may be further improved by using a post transfer metallization to provide access to a backside of the active device 410 to tie the body region of the active device 410.

Various aspects of the disclosure provide techniques for layer transfer and post transfer metallization to provide access to a backside of active devices of an integrated radio frequency (RF) integrated structure. By contrast, access to active devices, formed during a front-end-of line (FEOL) process, is conventionally provided during a middle-end-of-line (MEOL) processing that provides contacts between the gates and source/drain regions of the active devices and back-end-of-line (BEOL) interconnect layers (e.g., M1, M2, etc.). Aspects of the present disclosure involve a post layer transfer metallization process to form a back-biased active device, such as an antenna switch transistor for high quality (Q)-factor RF applications. Other applications include an active device in a low power amplifier module, a low noise amplifier and an antenna diversity switch.

Figure 5A:
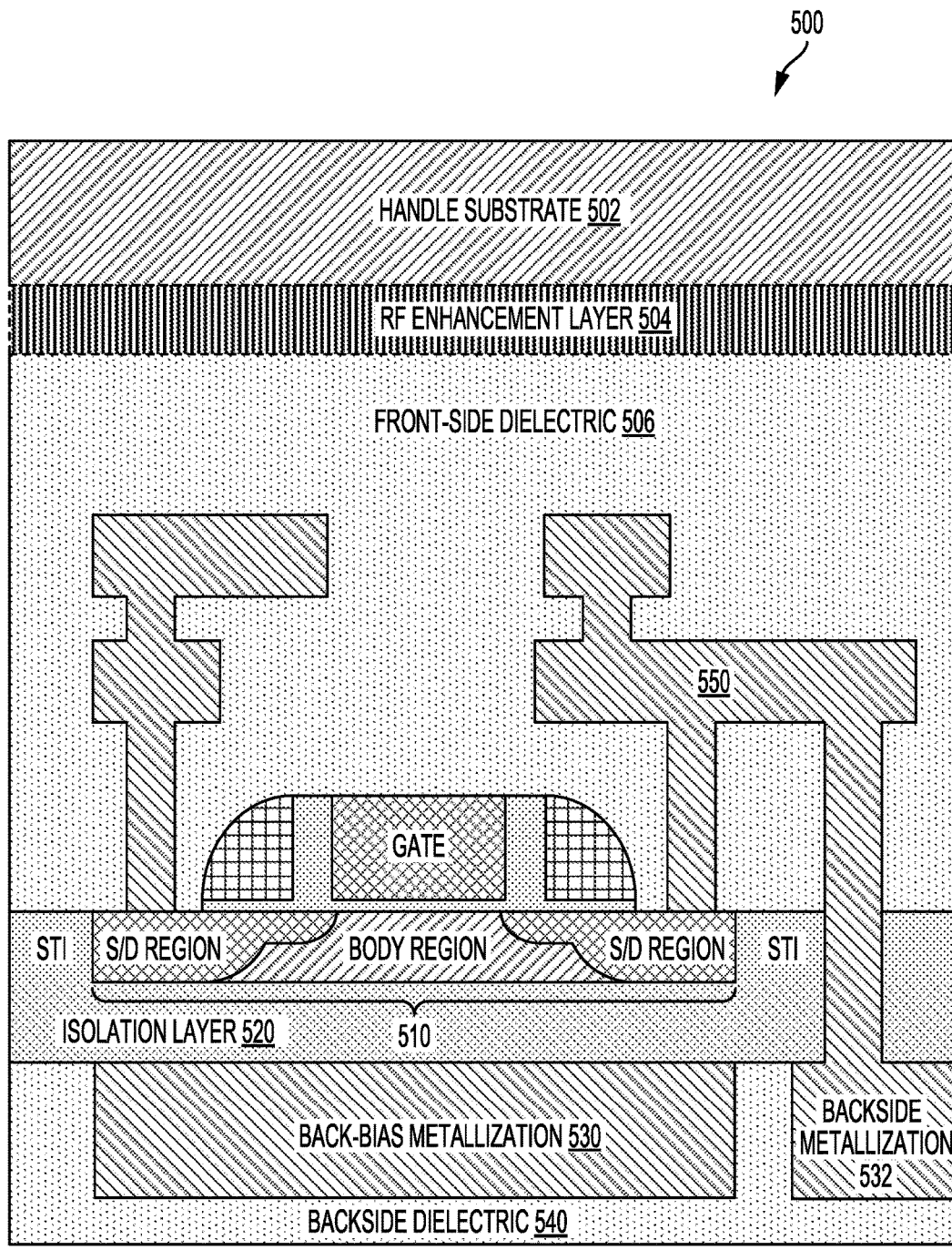
FIGS. 5A to 5C illustrate an integrated radio frequency (RF) circuit structure, in which a post layer transfer metallization forms a back-biased active device according to aspects of the present disclosure.

FIG. 5A is a cross sectional view of an integrated RF circuit structure 500, in which a post layer transfer metallization is used to form a back-biased active device according to aspects of the present disclosure. Representatively, the integrated RF circuit structure 500 includes an active device 510 having a gate, a body, and source/drain regions formed on an isolation layer 520. The isolation layer 520 may be a buried oxide (BOX) layer for an SOI implementation, in which the body and source/drain regions are formed from an SOI layer including shallow trench isolation (STI) regions supported by the BOX layer.

Figure 5B:
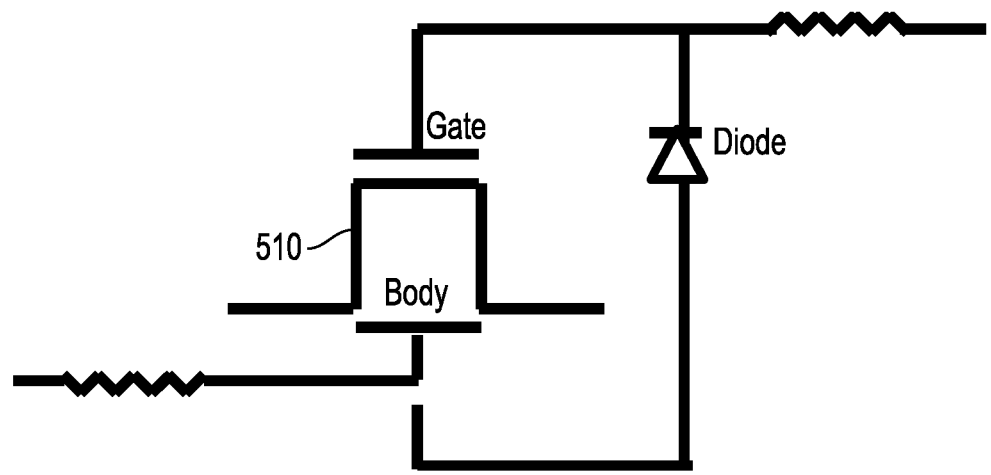
Figure 5C:
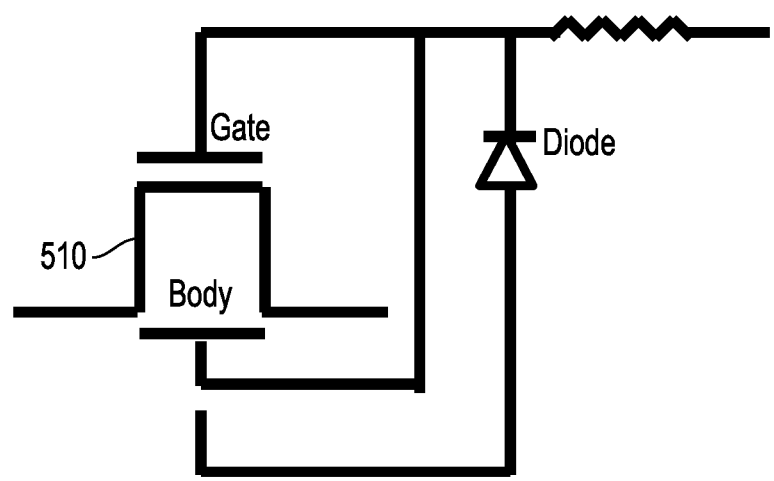

The integrated RF circuit structure 500 includes a front-side metallization 550 coupled to the source/drain regions of the active device 510, in which the front-side metallization 550 is arranged in a front-side dielectric layer 506. In addition, a handle substrate 502 is coupled to the front-side dielectric layer 506 through an RF enhancement layer 504. The RF enhancement layer 504 is optional, but may be a trap-rich layer composed of poly or amorphous silicon, silicon germanium (SiGe), carbon doped silicon, gallium nitride (GaN), gallium nitride (GaAs), or other like semiconductor material. A backside dielectric layer 540 is adjacent to and possibly supports the isolation layer 520. A backside metallization 532 is coupled to the front-side metallization 550. In this arrangement, the post layer transfer metallization process also forms a back-bias metallization 530 to back-bias the active device 510, as shown in FIGS. 5B and 5C. In FIG. 5B, the gate and the body of the active device 510 are independently biased, and in FIG. 5C, the gate and the body of the active device 510 are tied together, as shown in the diode connected layouts.

Referring again to FIG. 5A, the back-bias metallization 530 is provided in the backside dielectric layer 540 and arranged to support a portion of the isolation layer 520. The proximity of the back-bias metallization 530 and the body of the active device 510 helps prevent the formation of parasitic capacitance between the body of the active device 510 and the handle substrate 502. In this arrangement, the back-bias metallization 530 at least partially provides a radio frequency (RF) shield to the active device 510 for improved harmonics. In addition to back-biasing the active device 510, the back-bias metallization 530 may also operate as a heat sink for the active device 510.

According to aspects of the present disclosure, the handle substrate 502 may be composed of a semiconductor material, such as silicon. In this aspect of the present disclosure, the handle substrate 502 may be a processed wafer, including at least one other active device. Alternatively, the handle substrate 502 may be a passive substrate to further improve harmonics by reducing parasitic capacitance. In this arrangement, the handle substrate 502 may include at least one other passive device. As described herein, the term "passive substrate" may refer to a substrate of a diced wafer or panel, or may refer to the substrate of a wafer/panel that is not diced. In one arrangement, the passive substrate is comprised of glass, air, quartz, sapphire, high-resistivity silicon, or other like passive material. The passive substrate may also be a coreless substrate.

Figure 6A:
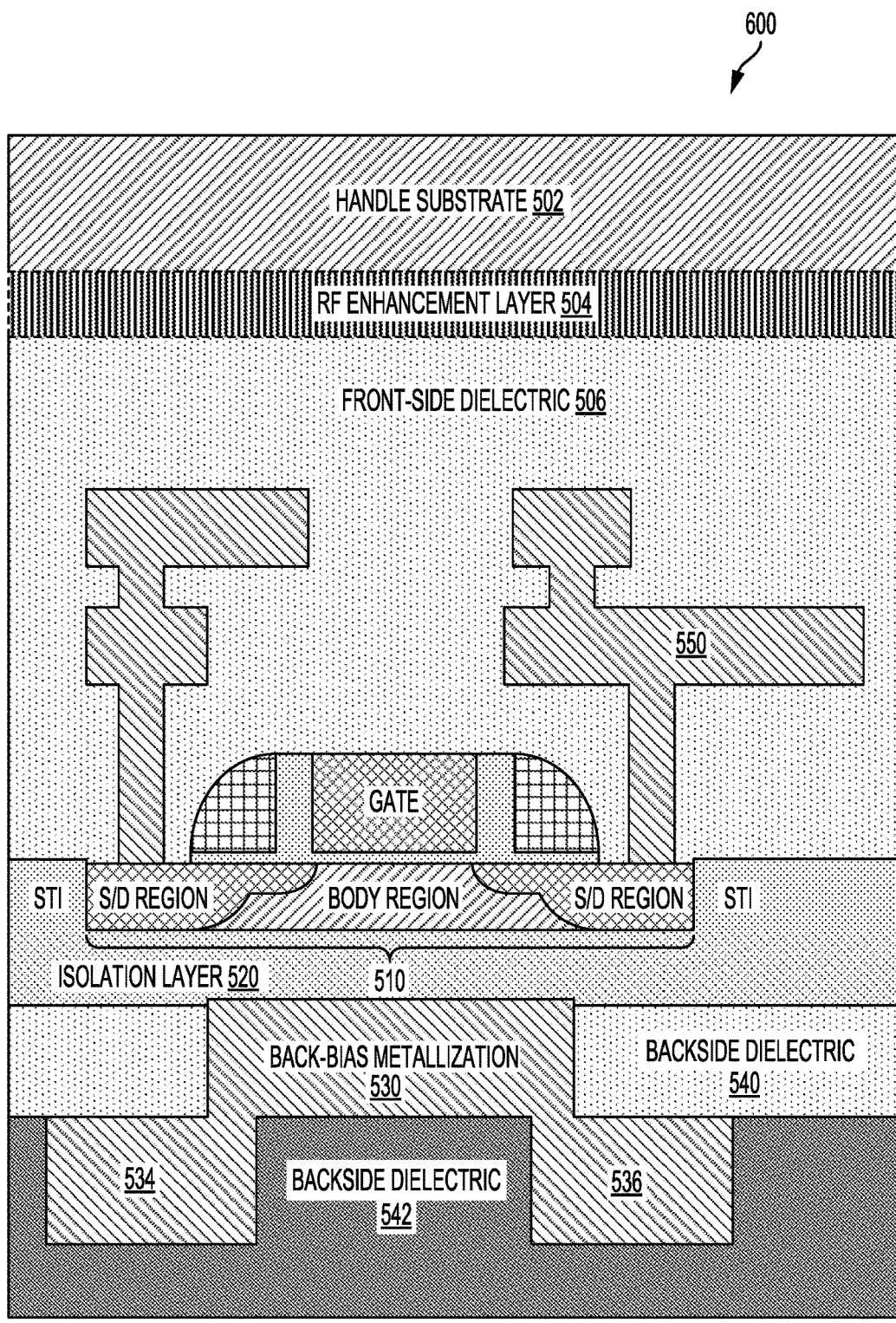
FIGS. 6A and 6B are cross sectional views of an integrated radio frequency (RF) circuit structure, in which a post layer transfer metallization is used to form a back-biased active device according to further aspects of the present disclosure.
Figure 6B:
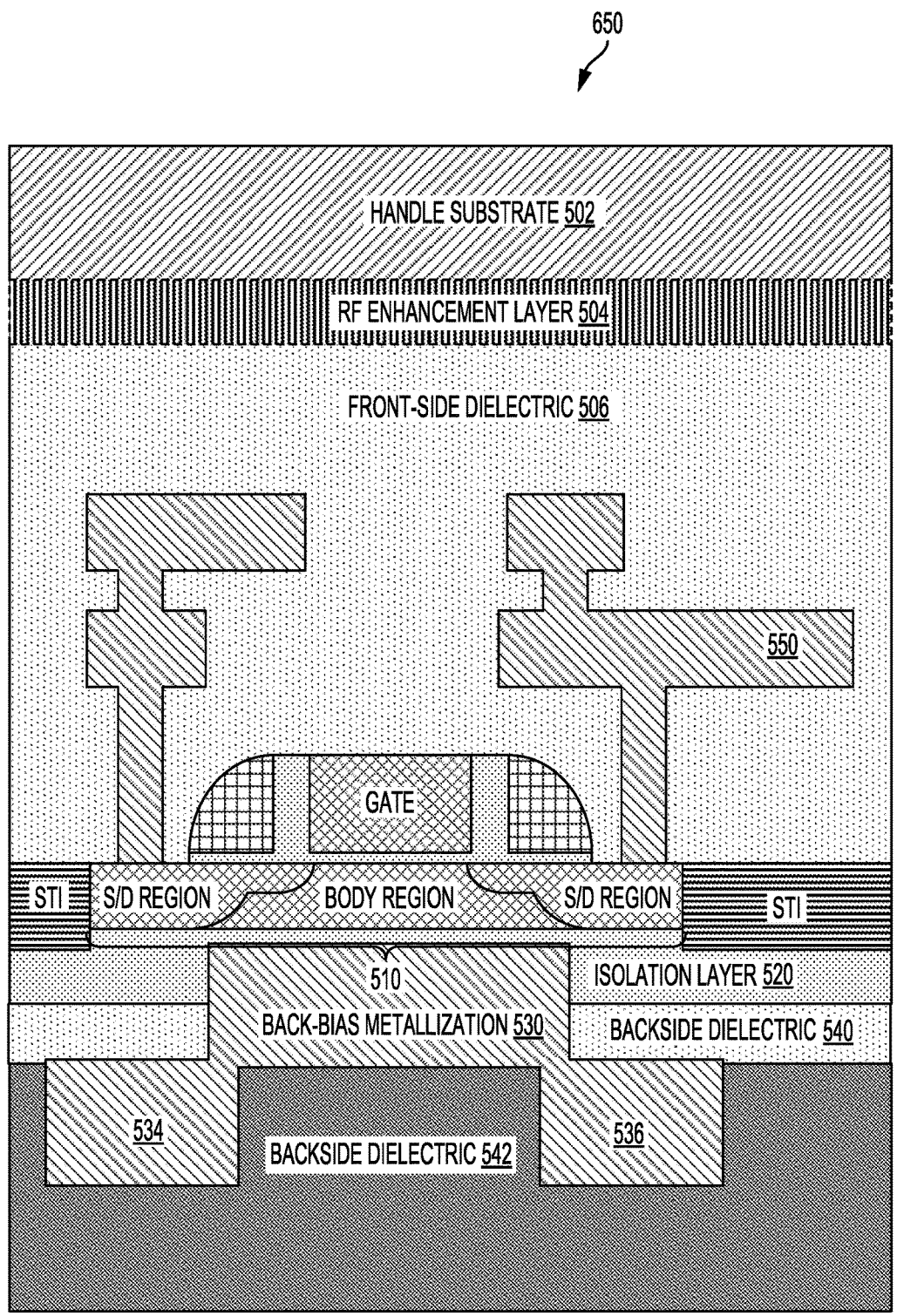

FIGS. 6A and 6B are cross sectional views of an integrated RF circuit structure, in which a post layer transfer metallization is used to form a back-biased active device according to further aspects of the present disclosure. As shown in FIG. 6A, an integrated RF circuit structure 600 is arranged in a configuration similar to the configuration of the integrated RF circuit structure 500 shown in FIG. 5A. In the configuration shown in FIG. 6A, however, a backside of the integrated RF circuit structure 600 includes a first backside dielectric layer 540 and a second back backside dielectric layer 542 supporting the first backside dielectric layer 540. In this arrangement, the second backside dielectric layer 542 is patterned and etched to provide cutaway portions 534 and 536 to the back-bias metallization 530. Formation of the cutaway portions 534 and 536 within the back-bias metallization 530 may further reduce parasitic capacitance. In particular, parasitic capacitance is reduced by increasing a distance between the source/drain regions of the active device 510 and the back-bias metallization 530, which may be useful in the case of multi-finger devices.

As shown in FIG. 6B, an integrated RF circuit structure 650 is arranged in a configuration similar to the configuration of the integrated RF circuit structure 600 shown in FIG. 6A. In the configuration shown in FIG. 6B, the backside of the integrated RF circuit structure 650 also includes a first backside dielectric layer 540 and a second backside dielectric layer 542 supporting the first backside dielectric layer 540. In this arrangement, however, a mask step is performed to etch into the isolation layer 520. Etching of the isolation layer 520 reduces a thickness of the isolation layer 520 between the back-bias metallization 530 and the body region of the active device 510, which increases beneficial capacitance between the body region of the active device 510 and the back-bias metallization 530. In this arrangement, the second backside dielectric layer 542 is patterned and etched to provide cutaway portions 534 and 536 to the back-bias metallization 530. This process reduces parasitic capacitance by increasing the distance between the source/drain regions of active device 510 and the cutaway portions 534 and 536 of the back-bias metallization 530.

Figure 7:
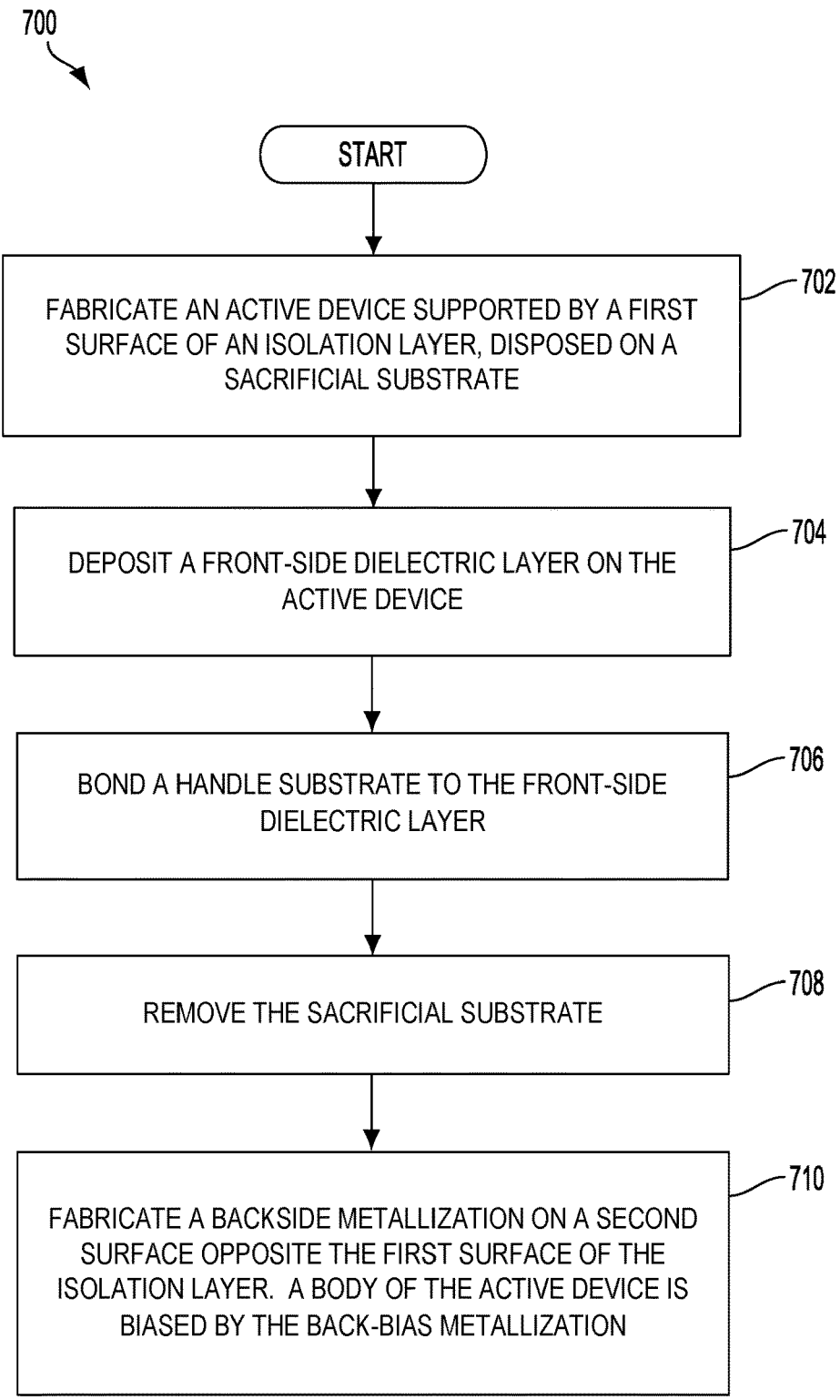
FIG. 7 is a process flow diagram illustrating a method of constructing an integrated radio frequency (RF) circuit structure according to aspects of the present disclosure.

FIG. 7 is a process flow diagram illustrating a method 700 of constructing an integrated radio frequency (RF) circuit structure according to an aspect of the present disclosure. In block 702, an active device is fabricated on a first surface of an isolation material, in which the isolation material is disposed on a sacrificial substrate. For example, as shown in FIG. 3A, an active device 510 is fabricated on a buried oxide (BOX) layer. In the arrangement shown in FIGS. 5A, 6A and 6B, the active device 510 (e.g., RF switch transistor) is arranged on a first surface of an isolation layer 520. In block 704, a front-side dielectric layer is deposited on the active device. For example, as shown in FIG. 5A, the front-side dielectric layer 506 is deposited on the active device 510.

Referring again to FIG. 7, in block 706, a handle substrate is bonded to the front-side dielectric layer. For example, as shown in FIG. 5A, the handle substrate 502 is bonded to the front-side dielectric layer 506, including the RF enhancement layer 504, which is optional. In block 708 of FIG. 7, the sacrificial substrate is removed. As shown in FIG. 3B, the layer-transfer process includes removal of the sacrificial substrate 301. In block 710, a backside metallization is fabricated on a second surface opposite the first surface of the isolation layer, in which a body of the active device is biased by a back-bias metallization. As shown in FIG. 5A, the active device 510 is fabricated on the first surface of the isolation layer 520, and the back-bias metallization 530 is fabricated an opposing surface of the isolation layer 520 distal from the handle substrate 502.

According to a further aspect of the present disclosure, integrated RF circuitry structures, including back-biased active devices, are described. The integrated RF circuit structure includes an active device on a first surface of an isolation layer. The integrated RF circuit structure also includes means for back-biasing a body of the active device arranged on a second surface opposite the first surface of the isolation layer. The integrated RF circuit structure further includes a handle substrate on a front-side dielectric layer disposed on the active device. The back-biasing means may be the back-bias metallization, shown in FIGS. 5A, 6A, and 6B. In another aspect, the aforementioned means may be any module or any apparatus configured to perform the functions recited by the aforementioned means.

Conventional transistors fabricated using silicon on insulator (SOI) technology suffer from the floating body effect, in which the transistor's body forms a capacitor against an insulated SOI substrate. In particular, parasitic coupling between the source/drain and the gate of the transistor may alter a gate potential in response to radio frequency (RF) signals. In this arrangement, charge that accumulates due to the parasitic capacitive coupling causes adverse effects, such as parasitic transistors in the structure and off-state leakage. In addition, the accumulated charge also causes dependence of the threshold voltage of the transistor on its previous states. As a result, aspects of the present disclosure include a layer transfer process to further separate the active devices from the substrate.

Various aspects of the disclosure provide techniques for back-biasing switch transistors in integrated RF circuit structures. The process flow for semiconductor fabrication of the integrated RF circuit structure may include front-end-of-line (FEOL) processes, middle-of-line (MOL) processes (also referred to as middle-end-of-line), and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe back-biasing of an antenna switch transistor in integrated RF circuit structures for high quality (Q)-factor RF applications. In one arrangement, a post layer-transfer metallization is used to form a post-layer transfer metallization layer to bias an active device body and reduce the floating body effect. The post transfer metallization process may form a back-bias metallization on a second surface of an isolation layer, in which a first surface of the isolation layer supports the active device. In this arrangement, a body of the active device is biased by the back-bias metallization. A handle substrate is also arranged on a front-side dielectric layer that is on the active device distal from the back-bias metallization. In this arrangement, the backside metallization at least partially provides an RF (radio frequency) shield to prevent high order harmonics in support of carrier aggregation.

Figure 8:
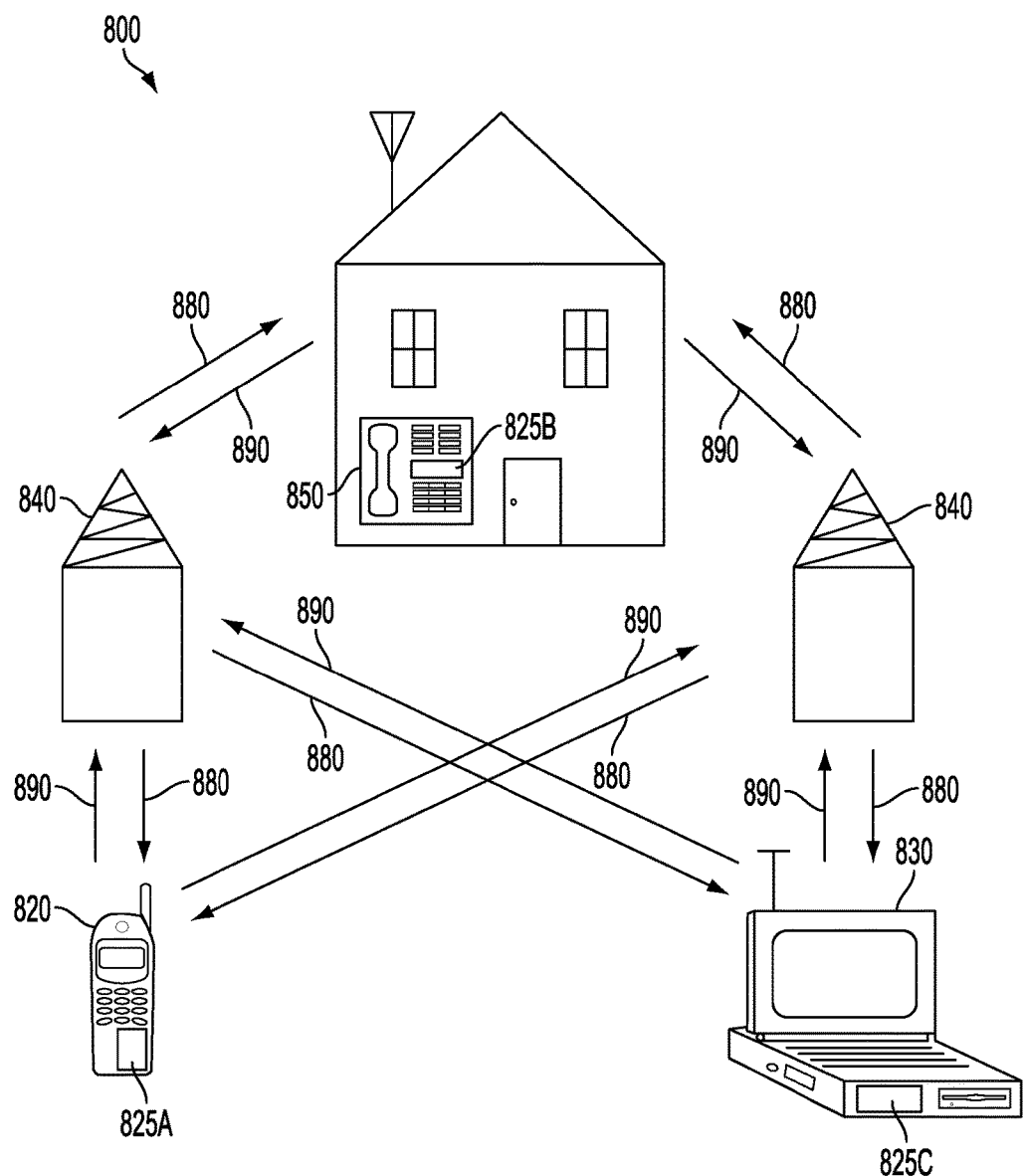
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed RF devices. It will be recognized that other devices may also include the disclosed RF devices, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed RF devices.

Figure 9:
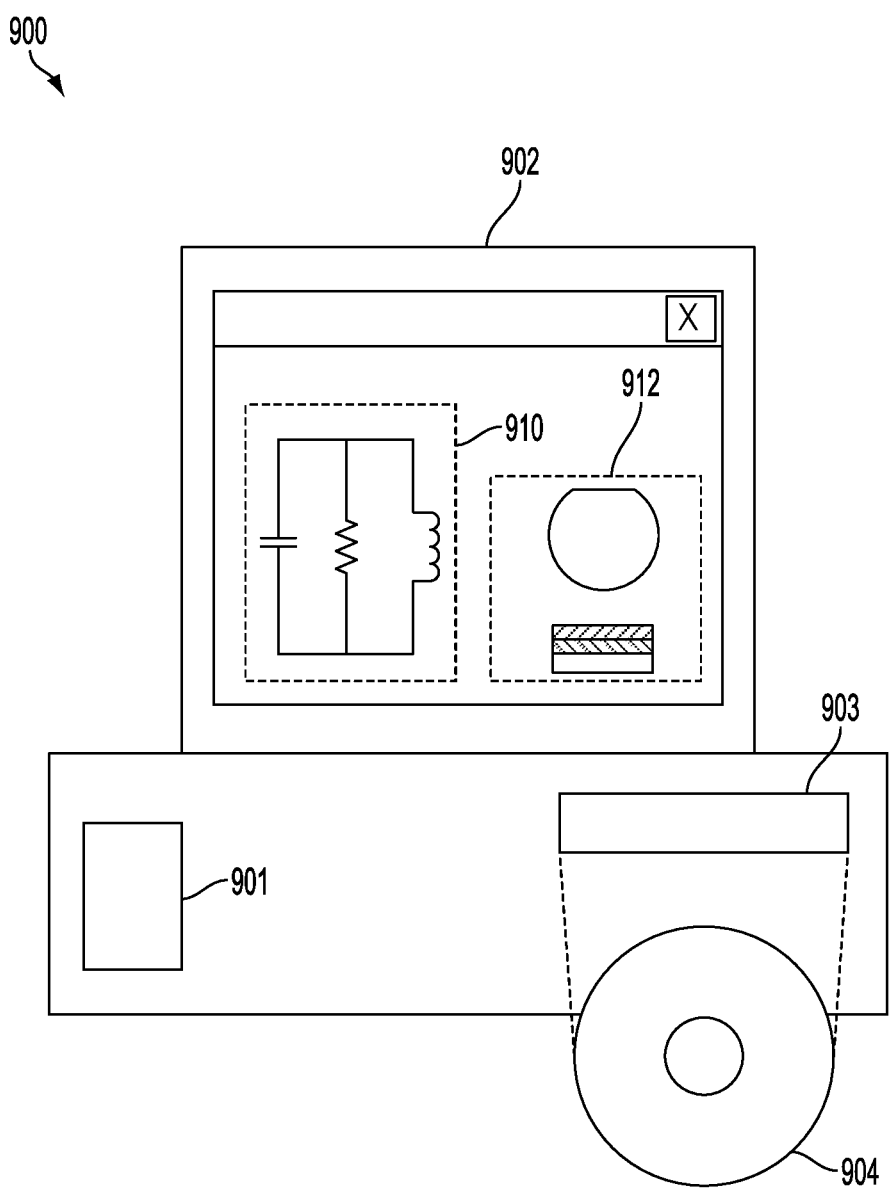
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the RF devices disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as an RF device. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A radio frequency (RF) front end module, comprising:
   an integrated RF circuit structure, comprising a switch transistor on a first surface of an isolation layer, a back-bias metallization on a second surface opposite the first surface of the isolation layer, in which a body of the switch transistor is biased by the back-bias metallization, and a handle substrate on a front-side dielectric layer disposed on the switch transistor; and
   an antenna coupled to an output of the switch transistor.

2. The RF front end module of claim 1, incorporated into at least one of a music player, a video player, an entertainment unit, a navigation device, a communications device, a personal digital assistant (PDA), a fixed location data unit, a mobile phone, and a portable computer.

3. The integrated RF circuit structure of claim 1, in which the back-bias metallization includes cutaway portions proximate source/drain regions of the switch transistor.

4. The integrated RF circuit structure of claim 1, in which the handle substrate includes at least one other active device or passive device.

5. The integrated RF circuit structure of claim 1, in which the body is biased independently or biased to a gate of the switch transistor.

* * * * *